United States Patent [19]

Zeidler

[11] 3,949,318
[45] Apr. 6, 1976

[54] OPTICAL INTERMEDIATE AMPLIFIER FOR A COMMUNICATIONS SYSTEM

[75] Inventor: Günter Zeidler, Unterpfaffenhofen, Germany

[73] Assignee: Siemens Aktiengesellschaft, Berlin & Munich, Germany

[22] Filed: Sept. 21, 1973

[21] Appl. No.: 399,636

[30] Foreign Application Priority Data
Oct. 3, 1972 Germany............................ 2248369

[52] U.S. Cl............. 330/4.3; 350/96 WG; 250/199
[51] Int. Cl.² ...................... H01S 3/10; G02B 5/14
[58] Field of Search ............ 350/96 WG, 96 R, 190; 330/4.3; 332/7.51; 331/94.5 E; 250/199

[56] References Cited
UNITED STATES PATENTS

| | | | |
|---|---|---|---|
| 2,157,166 | 5/1939 | Dimmick | 350/190 |
| 3,345,120 | 10/1967 | Palmer | 350/190 |
| 3,435,228 | 3/1969 | Gordon | 350/190 |
| 3,465,159 | 9/1969 | Starn | 350/96 WG |
| 3,571,737 | 3/1971 | Miller | 330/4.3 |
| 3,774,987 | 11/1973 | Boivin | 350/96 WG |

OTHER PUBLICATIONS

LF Staff Report, "Integrated Optics: A Status Report," 4/72, pp. 39–41, Laser Focus, Vol. 8, No. 4.

*Primary Examiner*—Maynard R. Wilbur
*Assistant Examiner*—N. Moskowitz
*Attorney, Agent, or Firm*—Hill, Gross, Simpson, Van Santen, Steadman, Chiara & Simpson

[57] ABSTRACT

An optical intermediate amplifier intended for a system of communications transmission by means of light waves through optical wave guides employs an optical amplifier for amplifying the light waves on the laser principle. The amplifier is provided with rectangular cross sectional areas traversed by the light waves which correspond in size with the cross-sectional areas of the core zones of the wave guides with which the amplifier is serially coupled, the rectangular cross sectional areas having heights of 0.1 to 10 μm and widths of 100 to 300 μm.

1 Claim, 3 Drawing Figures

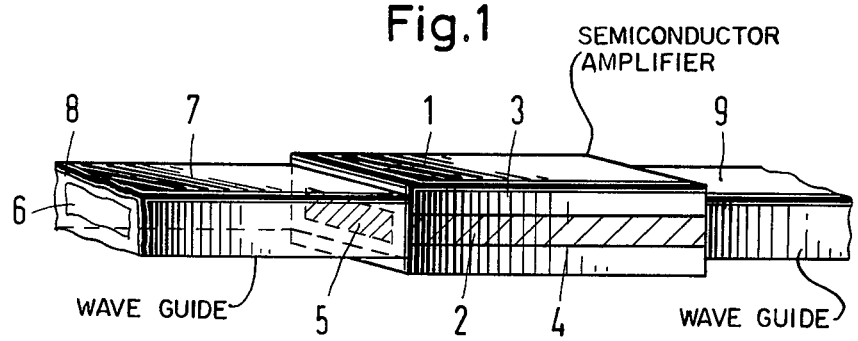
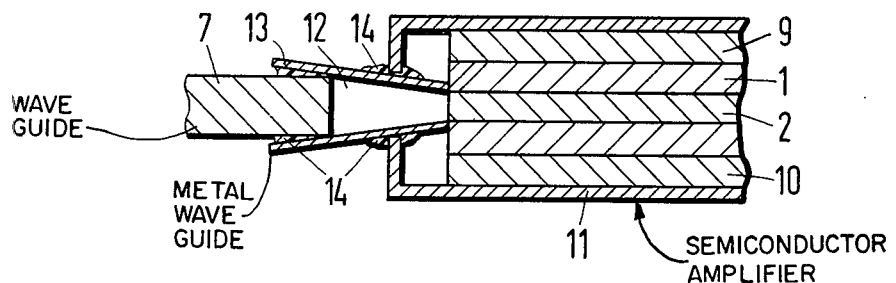
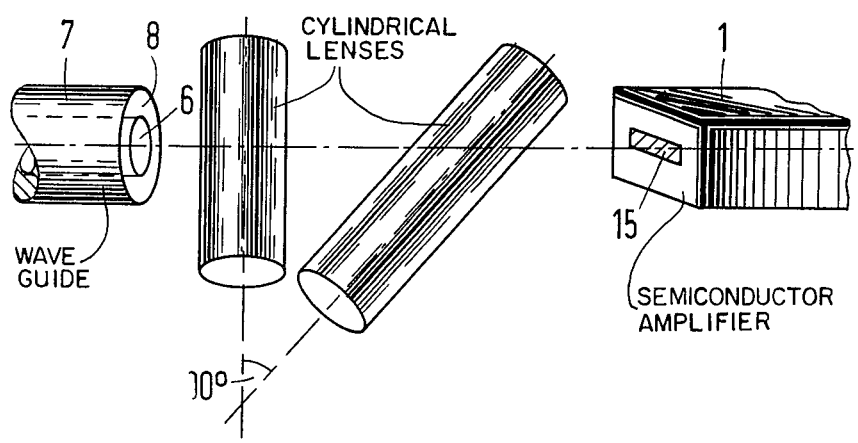

OPTICAL INTERMEDIATE AMPLIFIER FOR A COMMUNICATIONS SYSTEM

BACKGROUND OF THE INVENTION

1. Field of the Invention

This invention relates to an intermediate amplifier for a system intended for communications transmission using light waves passing through optical wave guides, and more particularly to such an amplifier which comprises an optical amplifier for amplifying the light waves on the laser principle.

2. Description of the Prior Art

An optical intermediate amplifier is disclosed in German patent application P 21 47 842.2 in which an optical intermediate amplifier operating as a laser amplifier amplifies light signals in a doped semiconductor monocrystal which functions as the active medium. One embodiment of the optical amplifier utilizes a doped monocrystal semiconductor which is electrically pumped and which is disposed between and coupled to the ends of a pair of light conductors. If desired, the end surfaces of the semiconductor laser are inclined toward each other to reduce undesirable oscillations in the semiconductor material. Resonator mirrors are provided in another embodiment of the invention to reflect the amplified light signals several times to obtain the desired mode in the amplified light signals which are then directed back through the same conductor and subsequently separated therefrom by branching to a separate conductor. In another embodiment, the material forming the laser amplifier is provided with mirrors which are arranged to produce a zig-zag path through the amplifying material for exit in a separate conductor in a direction opposite to the direction of incidence. In still another embodiment an optical active material of a solid state laser is applied to a portion of a circumferential shell of a light conductor, and the active material is optically pumped to amplify surface waves in the shell to obtain the amplified signal for the information transmission system. Through the utilization of integrated techniques, each embodiment is preferably formed with the wave conductor.

SUMMARY OF THE INVENTION

Because the amplification in a semiconductor laser takes place along a pn layer whose cross-sectional area is generally rectangular, and because in optical communications systems optical fibers are used whose cross-sectional areas are generally round, light losses are encountered at the junctions between the optical fibers and the semiconductor laser.

The object of the present invention, therefore, is to provide means for achieving low-loss coupling of the light signals in the intermediate amplifier.

In accordance with the invention, the foregoing object is achieved in that, to avoid light losses between the ends of the wave guides and the entry and exit surfaces of the amplifying material zone of the semiconductor amplifier, the rectangular cross-sectional areas of the semiconductor amplifier which are traversed by the light correspond in size with the cross-sectional areas of the core zones of the on-going wave guides, the rectangular cross-sectional areas having heights of 0.1 to 10 $\mu$m and width of 100 to 300 $\mu$m.

In this case, the end faces of the wave guides where the areas correspond in form are placed in direct contact with the semiconductor amplifier through the utilization of an adhesive immersion matching layer.

Where the cross-sectional areas traversed by the light differ from one another in form, a matching device is provided at the light entry and light exit surfaces of the semiconductor laser.

Advantageously, this matching device will consist of a short metal wave guide having a continuously modified cross-sectional area. Wave guides of this kind can readily be manufactured from metal tube by drawing and rolling operations, as is well understood in the art. At the same time, the wave guide can be designed as a guide for a plug-in connection between the wave guide and the semiconductor laser. In so doing, the metal wave guide is slipped over one end of the main wave guide and inserted at the other end into an opening in a housing in which the semiconductor laser is secured.

The manufacture of permanent connections between a wave guide and a semiconductor amplifier is achieved, in particular, by virtue of the fact that one or two crossed short focal length cylindrical lenses (cylindrical glass filaments) is, or are, arranged between the wave guide ends and the semiconductor amplifier. A device of this kind yields very small dimensions for the junction zone between a wave guide and a semiconductor amplifier.

BRIEF DESCRIPTION OF THE DRAWING

Other objects, features and advantages of the invention, its organization, construction and operation will be best understood from the following detailed description taken in conjunction with the accompanying drawing, on which:

FIG. 1 is a pictorial illustration of an input coupling device constructed in accordance with the invention;

FIG. 2 is a sectional elevation of another input coupling device constructed in accordance with the invention; and FIG. 3 is another pictorial view of another embodiment of an input coupling device according to the present invention.

DESCRIPTION OF THE PREFERRED EMBODIMENT

Referring to FIG. 1, an example is illustrated in which the core zone of a wave guide has the same cross-sectional area as the amplifier wave guide. A semiconductor amplifier 1 has been illustrated whose internal zone 2 has a higher refractive index than the surrounding zones 3 and 4. At the entry end of the semiconductor amplifier 1, the cross-sectional area 5 of the zone of higher refractive index corresponds with the rectangular cross-sectional area 6 of the core zone of the wave guide 7. The cross-sectional area 6 defines the core zone of the wave guide in relation to the envelope zone 8. The same dimensions exist between the semiconductor amplifier 1 and the core zone of the output wave guide 9. The rectangular shapes illustrated are employed in relation to all the wave guides of the communications system which carry light signals.

Referring to FIG. 2, a plug-in connection between a wave guide and a semiconductor amplifier has been illustrated in sectional elevation. The semi-conductor amplifier 1 comprises a zone 2 of higher refractive index which is connected, by way of an attachment device 10, to a housing 11. Through an opening 12, a metal wave guide 13, rolled to a matching shape, is introduced. In the metal wave guide 13, the incoming wave guide 7 is secured by an adhesive 14, and the connection between the wave guide 13 and the housing 11 is likewise achieved by utilization of the adhesive 14.

Referring now to FIG. 3, in another exemplary embodiment of the invention, a match of cross-sectional areas between a wave guide and a semiconductor amplifier has been illustrated. A wave guide 7 having a core zone 6 and an envelope zone 8 guides the transmitted light beam to a first cylindrical lens and a second cylindrical lens which is off-set through 90° with respect to the first cylindrical lens (glass filaments). By means of these cylindrical lenses, the light beam is reproduced on the light entry surface 15 of the semiconductor amplifier 1. Because the cylindrical lenses have very short focal length, an interval of some few millimeters is sufficient in this device to achieve matching of cross-sectional areas.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An intermediate amplifier for a communications transmission system for the transmission of communications by means of light waves in optical wave guides, comprising an optical wave guide; an optical amplifier for amplifying light waves according to the laser principle, said optical amplifier including a semiconductor amplifier; and a short hollow wave guide having a continually changing cross sectional area from one end thereof to the other, the end of said short wave guide having the smallest cross sectional area in direct contact with said semiconductor amplifier and the other end of said short hollow wave guide receiving the first-mentioned wave guide therein as a plug-in connection.

* * * * *